US009214963B1

United States Patent
Garani et al.

(10) Patent No.: US 9,214,963 B1
(45) Date of Patent: Dec. 15, 2015

(54) METHOD AND SYSTEM FOR MONITORING DATA CHANNEL TO ENABLE USE OF DYNAMICALLY ADJUSTABLE LDPC CODING PARAMETERS IN A DATA STORAGE SYSTEM

(71) Applicant: Western Digital Technologies, Inc., Irvine, CA (US)

(72) Inventors: Shayan S. Garani, San Diego, CA (US); Kent D. Anderson, Broomfield, CO (US); Anantha Raman Krishnan, Irvine, CA (US); Guangming Lu, Irvine, CA (US); Shafa Dahandeh, Laguna Niguel, CA (US); Andrew J. Tomlin, San Jose, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 147 days.

(21) Appl. No.: 13/725,965

(22) Filed: Dec. 21, 2012

(51) Int. Cl.
*H03M 13/00* (2006.01)
*H03M 13/29* (2006.01)

(52) U.S. Cl.
CPC ................................ *H03M 13/2906* (2013.01)

(58) Field of Classification Search
CPC ............ G06F 11/1072; G06F 11/1068; G06F 11/1048; G06F 11/1012; H03M 13/05; H03M 13/03; H03M 13/353; H03M 13/2903; H03M 13/29; H03M 13/152; H03M 13/13; H03M 13/618; H03M 13/6356; H03M 13/3738; G11C 2029/0411; G11C 16/3418; G11C 16/349
See application file for complete search history.

(56) References Cited

U.S. PATENT DOCUMENTS

| 5,621,660 | A  | 4/1997 | Chaddha et al. |
| 5,768,535 | A  | 6/1998 | Chaddha et al. |
| 6,011,868 | A  | 1/2000 | van den Branden et al. |
| 6,289,471 | B1 | 9/2001 | Gordon |
| 6,856,556 | B1 | 2/2005 | Hajeck |
| 6,895,547 | B2 | 5/2005 | Eleftheriou et al. |
| 6,934,904 | B2 | 8/2005 | Talagala et al. |

(Continued)

FOREIGN PATENT DOCUMENTS

JP      2008102819 A    10/2006
KR    1020100076447       8/2011

(Continued)

OTHER PUBLICATIONS

Guangming Lu, et al. U.S. Appl. No. 13/742,248, filed Jan. 15, 2013,(This application Claims Priority from U.S. Appl. No. 61/738,732, Dec. 18, 2012), 32 pages.

(Continued)

*Primary Examiner* — Guerrier Merant
(74) *Attorney, Agent, or Firm* — McDermott Will & Emery LLP

(57) ABSTRACT

A data storage system configured to adaptively code data and related methods are disclosed. In some embodiments of the present invention, a data storage system includes a controller and a non-volatile memory array having a plurality of memory pages. The controller includes a channel monitor that determines the quality of read signals from the pages when they are read, and provides adjustment metrics to aid in the selection of a code rate, such as a code rate for a low-density parity-check (LDPC) code. In this way, the code rate used for data encoding can be dynamically adjusted to accommodate degradation of the non-volatile memory array over its useable life.

33 Claims, 7 Drawing Sheets

(56) References Cited

U.S. PATENT DOCUMENTS

| | | | |
|---|---|---|---|
| 7,072,417 B1 | 7/2006 | Burd et al. | |
| 7,126,857 B2 | 10/2006 | Hajeck | |
| 7,129,862 B1 | 10/2006 | Shirdhonkar et al. | |
| 7,149,846 B2 | 12/2006 | Hetrick | |
| 7,263,651 B2* | 8/2007 | Xia et al. | 714/774 |
| 7,346,832 B2 | 3/2008 | Richardson et al. | |
| 7,395,490 B2 | 7/2008 | Richardson et al. | |
| 7,409,492 B2 | 8/2008 | Tanaka et al. | |
| 7,430,136 B2 | 9/2008 | Merry, Jr. et al. | |
| 7,447,807 B1 | 11/2008 | Merry et al. | |
| 7,500,172 B2 | 3/2009 | Shen et al. | |
| 7,502,256 B2 | 3/2009 | Merry, Jr. et al. | |
| 7,509,441 B1 | 3/2009 | Merry et al. | |
| 7,596,643 B2 | 9/2009 | Merry, Jr. et al. | |
| 7,653,778 B2 | 1/2010 | Merry, Jr. et al. | |
| 7,657,816 B2 | 2/2010 | Cohen et al. | |
| 7,685,337 B2 | 3/2010 | Merry, Jr. et al. | |
| 7,685,338 B2 | 3/2010 | Merry, Jr. et al. | |
| 7,685,374 B2 | 3/2010 | Diggs et al. | |
| 7,685,494 B1* | 3/2010 | Varnica et al. | 714/752 |
| 7,733,712 B1 | 6/2010 | Walston et al. | |
| 7,739,576 B2 | 6/2010 | Radke | |
| 7,765,373 B1 | 7/2010 | Merry et al. | |
| 7,797,611 B2 | 9/2010 | Dholakia et al. | |
| 7,809,994 B2 | 10/2010 | Gorobets | |
| 7,814,393 B2 | 10/2010 | Kyung et al. | |
| 7,898,855 B2 | 3/2011 | Merry, Jr. et al. | |
| 7,912,991 B1 | 3/2011 | Merry et al. | |
| 7,913,149 B2 | 3/2011 | Gribok et al. | |
| 7,936,603 B2 | 5/2011 | Merry, Jr. et al. | |
| 7,962,792 B2 | 6/2011 | Diggs et al. | |
| 8,078,918 B2 | 12/2011 | Diggs et al. | |
| 8,090,899 B1 | 1/2012 | Syu | |
| 8,095,851 B2 | 1/2012 | Diggs et al. | |
| 8,108,692 B1 | 1/2012 | Merry et al. | |
| 8,122,185 B2 | 2/2012 | Merry, Jr. et al. | |
| 8,122,323 B2* | 2/2012 | Leung et al. | 714/774 |
| 8,127,048 B1 | 2/2012 | Merry et al. | |
| 8,135,903 B1 | 3/2012 | Kan | |
| 8,151,020 B2 | 4/2012 | Merry, Jr. et al. | |
| 8,161,227 B1 | 4/2012 | Diggs et al. | |
| 8,161,345 B2 | 4/2012 | Graef | |
| 8,166,245 B2 | 4/2012 | Diggs et al. | |
| 8,176,284 B2 | 5/2012 | Frost et al. | |
| 8,176,360 B2 | 5/2012 | Frost et al. | |
| 8,179,292 B2 | 5/2012 | Nakagawa | |
| 8,181,089 B1 | 5/2012 | Fernandes et al. | |
| 8,243,525 B1 | 8/2012 | Kan | |
| 8,254,172 B1 | 8/2012 | Kan | |
| 8,261,012 B2 | 9/2012 | Kan | |
| 8,296,625 B2 | 10/2012 | Diggs et al. | |
| 8,312,207 B2 | 11/2012 | Merry, Jr. et al. | |
| 8,316,176 B1 | 11/2012 | Phan et al. | |
| 8,327,226 B2* | 12/2012 | Rub | 714/763 |
| 8,339,919 B1 | 12/2012 | Lee | |
| 8,341,339 B1 | 12/2012 | Boyle et al. | |
| 8,375,151 B1 | 2/2013 | Kan | |
| 8,392,635 B2 | 3/2013 | Booth et al. | |
| 8,397,107 B1 | 3/2013 | Syu et al. | |
| 8,407,449 B1 | 3/2013 | Colon et al. | |
| 8,423,722 B1 | 4/2013 | Deforest et al. | |
| 8,433,858 B1 | 4/2013 | Diggs et al. | |
| 8,443,167 B1 | 5/2013 | Fallone et al. | |
| 8,447,920 B1 | 5/2013 | Syu | |
| 8,458,435 B1 | 6/2013 | Rainey, III et al. | |
| 8,478,930 B1 | 7/2013 | Syu | |
| 8,489,854 B1 | 7/2013 | Colon et al. | |
| 8,503,237 B1 | 8/2013 | Horn | |
| 8,521,972 B1 | 8/2013 | Boyle et al. | |
| 8,549,236 B2 | 10/2013 | Diggs et al. | |
| 8,583,835 B1 | 11/2013 | Kan | |
| 8,601,311 B2 | 12/2013 | Horn | |
| 8,601,313 B1 | 12/2013 | Horn | |
| 8,612,669 B1 | 12/2013 | Syu et al. | |
| 8,612,804 B1 | 12/2013 | Kang et al. | |
| 8,615,681 B2 | 12/2013 | Horn | |
| 8,638,602 B1 | 1/2014 | Horn | |
| 8,639,872 B1 | 1/2014 | Boyle et al. | |
| 8,683,113 B2 | 3/2014 | Abasto et al. | |
| 8,700,834 B2 | 4/2014 | Horn et al. | |
| 8,700,950 B1 | 4/2014 | Syu | |
| 8,700,951 B1 | 4/2014 | Call et al. | |
| 8,706,985 B1 | 4/2014 | Boyle et al. | |
| 8,707,104 B1 | 4/2014 | Jean | |
| 8,745,277 B2 | 6/2014 | Kan | |
| 8,751,906 B2* | 6/2014 | Yeo et al. | 714/774 |
| 8,972,826 B2 | 3/2015 | Lu | |
| 2003/0037298 A1 | 2/2003 | Eleftheriou et al. | |
| 2004/0098659 A1 | 5/2004 | Bjerke et al. | |
| 2005/0204253 A1 | 9/2005 | Sukhobok et al. | |
| 2005/0216821 A1 | 9/2005 | Harada | |
| 2005/0246617 A1 | 11/2005 | Kyung et al. | |
| 2006/0036925 A1 | 2/2006 | Kyung et al. | |
| 2006/0036933 A1 | 2/2006 | Blankenship et al. | |
| 2006/0085593 A1 | 4/2006 | Lubbers et al. | |
| 2007/0124648 A1 | 5/2007 | Dholakia et al. | |
| 2008/141054 A1 | 6/2008 | Danilak | |
| 2008/0155160 A1 | 6/2008 | McDaniel | |
| 2008/0168304 A1 | 7/2008 | Flynn et al. | |
| 2008/0195900 A1 | 8/2008 | Chang et al. | |
| 2008/0222490 A1* | 9/2008 | Leung et al. | 714/763 |
| 2008/0244353 A1 | 10/2008 | Dholakia et al. | |
| 2008/0282128 A1 | 11/2008 | Lee et al. | |
| 2008/0301521 A1 | 12/2008 | Gunnam et al. | |
| 2008/0316819 A1 | 12/2008 | Lee | |
| 2009/0070652 A1 | 3/2009 | Myung et al. | |
| 2009/0193184 A1 | 7/2009 | Yu et al. | |
| 2009/0240873 A1 | 9/2009 | Yu et al. | |
| 2009/0241008 A1* | 9/2009 | Kim et al. | 714/755 |
| 2009/0241009 A1 | 9/2009 | Kong et al. | |
| 2009/0249159 A1 | 10/2009 | Lee et al. | |
| 2009/0259805 A1 | 10/2009 | Kilzer et al. | |
| 2010/0017650 A1 | 1/2010 | Chin et al. | |
| 2010/0020611 A1 | 1/2010 | Park | |
| 2010/0049914 A1 | 2/2010 | Goodwin | |
| 2010/0083071 A1 | 4/2010 | Shen et al. | |
| 2010/0100788 A1 | 4/2010 | Yang et al. | |
| 2010/0107030 A1 | 4/2010 | Graef | |
| 2010/0125695 A1 | 5/2010 | Wu et al. | |
| 2010/0131819 A1 | 5/2010 | Graef | |
| 2010/0174849 A1 | 7/2010 | Walston et al. | |
| 2010/0241928 A1* | 9/2010 | Kim et al. | 714/763 |
| 2010/0250793 A1 | 9/2010 | Syu | |
| 2010/0268985 A1 | 10/2010 | Larsen et al. | |
| 2010/0275088 A1 | 10/2010 | Graef | |
| 2010/0315874 A1 | 12/2010 | Ghodsi | |
| 2011/0066793 A1 | 3/2011 | Burd | |
| 2011/0072333 A1* | 3/2011 | Kuo | 714/773 |
| 2011/0099323 A1 | 4/2011 | Syu | |
| 2011/0126078 A1 | 5/2011 | Ueng et al. | |
| 2011/0179333 A1 | 7/2011 | Wesel et al. | |
| 2011/0191649 A1 | 8/2011 | Lim et al. | |
| 2011/0213919 A1 | 9/2011 | Frost et al. | |
| 2011/0214037 A1 | 9/2011 | Okamura et al. | |
| 2011/0231737 A1 | 9/2011 | Dachiku | |
| 2011/0231739 A1 | 9/2011 | Kim | |
| 2011/0239088 A1 | 9/2011 | Post | |
| 2011/0246862 A1 | 10/2011 | Graef | |
| 2011/0252294 A1 | 10/2011 | Ng et al. | |
| 2011/0283049 A1 | 11/2011 | Kang et al. | |
| 2011/0296273 A1 | 12/2011 | Rub | |
| 2011/0302477 A1 | 12/2011 | Goss et al. | |
| 2012/0072654 A1 | 3/2012 | Olbrich et al. | |
| 2012/0079189 A1 | 3/2012 | Colgrove et al. | |
| 2012/0084506 A1 | 4/2012 | Colgrove et al. | |
| 2012/0084507 A1 | 4/2012 | Colgrove et al. | |
| 2012/0260020 A1 | 10/2012 | Suryabudi et al. | |
| 2012/0272000 A1 | 10/2012 | Shalvi | |
| 2012/0278531 A1 | 11/2012 | Horn | |
| 2012/0284460 A1 | 11/2012 | Guda | |
| 2012/0317459 A1* | 12/2012 | Yeo et al. | 714/763 |
| 2012/0324191 A1 | 12/2012 | Strange et al. | |
| 2013/0054980 A1 | 2/2013 | Frost et al. | |
| 2013/0080857 A1* | 3/2013 | Lee et al. | 714/773 |

(56) References Cited

U.S. PATENT DOCUMENTS

| | | |
|---|---|---|
| 2013/0132638 A1 | 5/2013 | Horn et al. |
| 2013/0145106 A1 | 6/2013 | Kan |
| 2013/0290793 A1 | 10/2013 | Booth et al. |
| 2014/0059405 A1 | 2/2014 | Syu et al. |
| 2014/0082450 A1* | 3/2014 | Yang et al. .................... 714/758 |
| 2014/0115427 A1 | 4/2014 | Lu |
| 2014/0133220 A1 | 5/2014 | Danilak et al. |
| 2014/0136753 A1 | 5/2014 | Tomlin et al. |
| 2014/0149826 A1 | 5/2014 | Lu et al. |
| 2014/0157078 A1 | 6/2014 | Danilak et al. |

FOREIGN PATENT DOCUMENTS

| | | |
|---|---|---|
| KR | 100929371 | 11/2011 |
| WO | 2012058328 A1 | 5/2012 |
| WO | 2014065967 A1 | 5/2014 |
| WO | 2014084960 A1 | 6/2014 |
| WO | 2014088684 A1 | 6/2014 |

OTHER PUBLICATIONS

Shayan S. Garani, U.S. Appl. No. 13/417,057, filed Mar. 9, 2012, 30 pages.

Guangming Lu, et. al. U.S. Appl. No. 13/718,289, filed Dec. 18, 2012, 27 pages.

Guangming Lu, et. al. U.S. Appl. No. 13/742,243, filed Jan. 15, 2013,(This application Claims Priority from U.S. Appl. No. 61/738,764, Dec. 18, 2012), 22 pages.

Shayan S. Garani, et. al., U.S. Appl. No. 13/725,965, filed Dec. 21, 2012, 31 pages.

U.S. Appl. No. 13/659,099, filed Oct. 24, 2012, to Guangming Lu, 26 pages.

U.S. Appl. No. 13/659,099, filed Oct. 24, 2012, Lu.

U.S. Appl. No. 14/570,820, filed Dec. 15, 2014, Lu.

* cited by examiner

| Column Weight | P Matrix Size (bits) | Code Length = 512 + 64×Δ (bytes) | | |
|---|---|---|---|---|
| | | | Δ = 1 | Δ = 2 |
| 7 | 64 | C1 Row Weight | 72 | 80 |
| | | Code Length (bytes) | 576 | 640 |
| | | User Data (bytes) | 520 | 584 |
| | | Code Rate | 0.903 | 0.9125 |
| | 128 | C3 Row Weight | 36 | 40 |
| | | Code Length (bytes) | 576 | 640 |
| | | User Data (bytes) | 464 | 528 |
| | | Code Rate | 0.806 | 0.825 |
| 8 | 64 | C2 Row Weight | 72 | 80 |
| | | Code Length (bytes) | 576 | 640 |
| | | User Data (bytes) | 512 | 576 |
| | | Code Rate | 0.889 | 0.900 |
| | 128 | C4 Row Weight | 36 | 40 |
| | | Code Length (bytes) | 576 | 640 |
| | | User Data (bytes) | 448 | 512 |
| | | Code Rate | 0.778 | 0.800 |

*FIGURE 3B*

METHOD AND SYSTEM FOR MONITORING DATA CHANNEL TO ENABLE USE OF DYNAMICALLY ADJUSTABLE LDPC CODING PARAMETERS IN A DATA STORAGE SYSTEM

BACKGROUND

1. Technical Field

This disclosure relates to data storage systems, such as solid state drives, for computer systems. More particularly, the disclosure relates to adaptively changing error correction code rates for data storage systems based on read channel feedback.

2. Description of the Related Art

Non-volatile memory arrays often have limited endurance. The endurance of the memory array is typically contingent on usage pattern and wear. In addition, endurances depend on a particular type of the non-volatile memory array. For example, memory arrays with multi-level cell (MLC) NAND media typically have a lower endurance than memory arrays with single-level cell (SLC) NAND media. To protect user data stored to memory arrays from corruption, which may be caused by a diminished endurance, parity data can be determined and stored along with user data to facilitate error detection and/or correction.

BRIEF DESCRIPTION OF THE DRAWINGS

Systems and methods that embody the various features of the invention will now be described with reference to the following drawings, in which:

FIG. 3B is a table illustrating relationships between low-density parity-check (LDPC) coding parameters and LDPC code word lengths according to one embodiment of the invention.

DETAILED DESCRIPTION OF SPECIFIC EMBODIMENTS

While certain embodiments are described, these embodiments are presented by way of example only, and are not intended to limit the scope of protection. Indeed, the novel methods and systems described herein may be embodied in a variety of other forms. Furthermore, various omissions, substitutions, and changes in the form of the methods and systems described herein may be made without departing from the scope of protection.

In some embodiments, "coding" or "to code" data as used in this disclosure refer to the process of encoding data and/or the process of decoding data.

Overview

Data storage systems such as solid state drives typically include one or more controllers coupled with non-volatile memory arrays. Non-volatile memory typically wears out over time and as a result the number of bit errors typically increases the longer the memory is in use.

In some embodiments of the present invention, a data storage system includes a controller and a non-volatile memory array having a plurality of memory pages. The controller includes a channel monitor that determines the quality of read signals from the pages when they are read, and provides adjustment metrics to aid in the selection of a code rate, such as a code rate for a low-density parity-check (LDPC) code. In this way, the code rate used for data encoding can be dynamically adjusted to accommodate degradation of the non-volatile memory array over its useable life.

In one embodiment, the adjustment of code word lengths may be made by choosing an appropriate code word length from multiple pre-defined code word lengths and their corresponding coding parameters. In addition, the controller can be paired with memory arrays of different formats made by different vendors, with each format assigned a different set of code word lengths and parameters. In this manner, the controller can selectively adapt its operations over the life of the storage system, regardless of the different formats of the memory arrays made by different vendors.

In some embodiments, a controller of a storage system adjusts coding parameters for coding user data as memory pages, blocks, or dies of the non-volatile memory array age and/or wear out due, in part, to use of the memory array. The mechanism of adjusting coding parameters enables the controller to support additional parity per unit data over time, thereby improving the error correction or detection capabilities as the quality (e.g., data retention capabilities) of the memory array diminishes. Moreover, the mechanism of adjusting coding parameters facilitates a balancing of decoding time due to additional parity per unit data with error correction or detection benefits of additional parity data. In addition, the controller can store adjusted coding parameters for memory pages, blocks, or dies of the memory array to permit different code or parity rates for different memory pages, blocks, or dies.

System Overview

Figure 1:
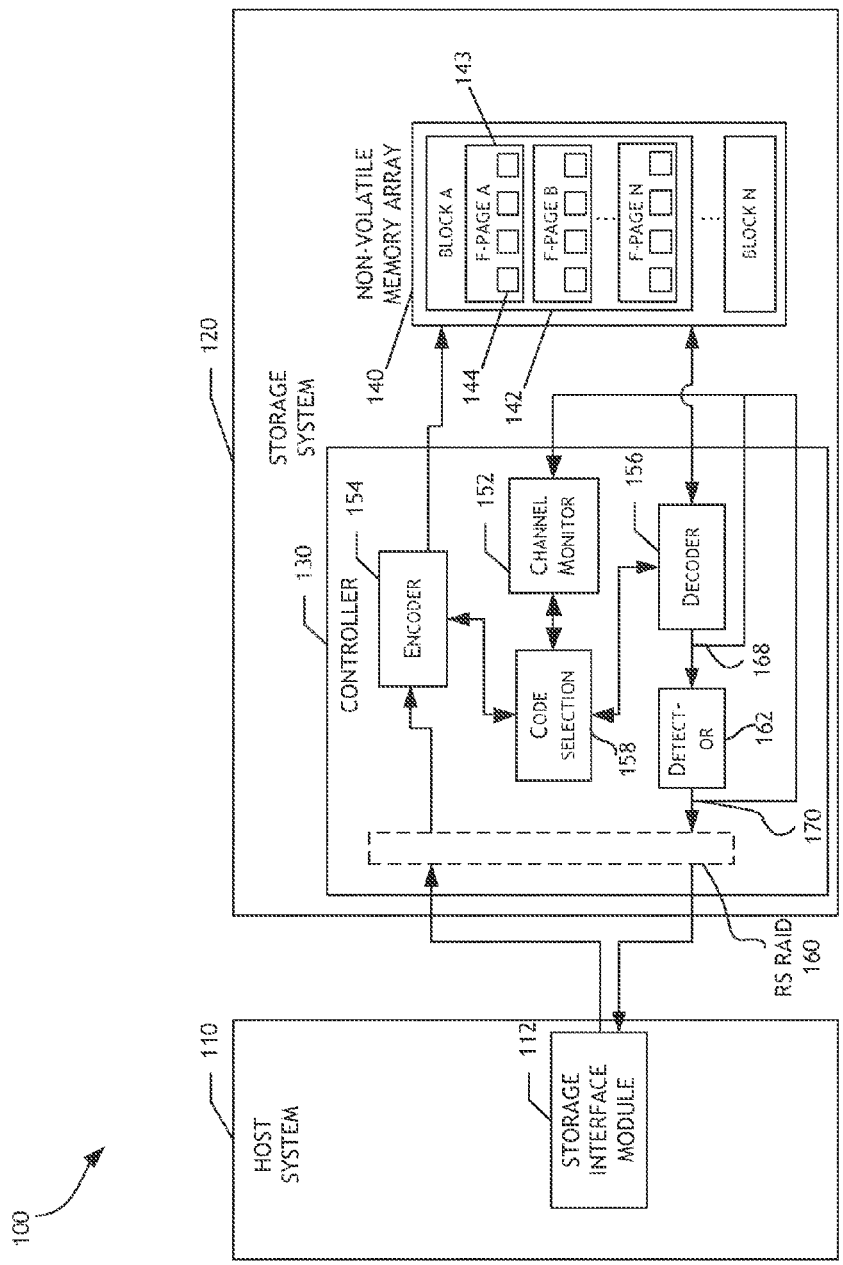
FIG. 1 illustrates a storage system that adaptively codes data according to one embodiment of the invention.

FIG. 1 illustrates a data storage system 120 that adaptively codes data according to one embodiment of the invention. As is shown, a data storage system 120 (e.g., hybrid hard drive, solid state drive, etc.) includes a controller 130 and a non-volatile memory array 140, which comprises one or more blocks of storage, identified as Block "A" 142 through Block "N". Each block comprises a plurality of flash pages (F-pages). For example, Block A 142 of FIG. 1 includes a plurality of F-pages, identified as F-pages A 153, B, through N. In some embodiments, each "F-page" is a smallest grouping of memory cells in the non-volatile memory array 140 that can be programmed in a single operation or as a unit. Further, each F-page includes a plurality of error correcting code pages (E-pages). In the illustrated embodiment, each F-page includes four E-pages that are illustrated as four boxes, including E-page 144. Other embodiments may use F-pages or E-pages that are defined differently or each F-page may include greater or fewer than four E-pages.

The controller 130 can receive data and/or storage access commands from a storage interface module 112 (e.g., a device driver) in a host system 110. Storage access commands communicated by the storage interface 112 can include write and read commands issued by the host system 110. The commands can specify a logical block address in the data storage system 120, and the controller 130 can execute the received commands in the non-volatile memory array 140. In a hybrid hard drive, data may be stored in magnetic media storage component (not shown in FIG. 1) in addition to the non-volatile memory array 140.

The data storage system 120 can store data received from the host system 110 so that the data storage system 120 can act as memory storage for the host system 110. To facilitate this function, the controller 130 can implement a logical interface. The logical interface can present to the host system 110 storage system memory as a set of logical addresses (e.g., contiguous address) where data can be stored. Internally, the controller 130 can map logical addresses to various physical memory addresses in the non-volatile memory array 140 and/or other memory module(s).

The controller 130 includes an encoder module 154. In one embodiment, the encoder module 154 encodes data (e.g., user data) to be written to memory pages, such as E-pages, of the non-volatile memory array 140. The encoder module 154 may dynamically use different coding parameters to accommodate changing condition of the non-volatile memory array 140. Similarly, the decoder module 156 decodes data read from the memory pages and can similarly use different coding parameters.

The coding parameters can include LDPC coding parameters, such as the column weight of a G (generator) or H (parity check) coding matrix, the row weight of a G or H coding matrix, a P matrix size (e.g., where the P matrix is a sub-matrix of a G or H coding matrix), and the like. Further, the encoder and decoder modules 154 and 156 can determine parity data for unpadded or padded user data, as well as decode user data having corresponding parity data and padding. In addition, the encoder and decoder modules 154 and 156 can adjust a code rate for coding data by adjusting the coding parameters. The controller 130 can further include internal memory (not shown), which may be of one or more suitable memory types.

In one embodiment, the adjustment of the coding parameters is made in response to result provided by a channel monitor 152 in the controller 130. The channel monitor in one embodiment monitors the quality of the data read from the non-volatile memory array 140. For example, the channel monitor 152 may dynamically track the (signal-to-noise ratio) SNR quality in the read channel of the non-volatile memory array 140 via measured log-likelihood ratios (LLRs) and error statistics such as bit error rates. In an embodiment where LDPC is used, the power up of the encoder and decoder modules will be controlled using a reliable master code which will reside in a Read Only Memory (ROM), and the overall system is configured to operate with a base code during the boot-up process.

In one embodiment, the controller 130 also includes an error detection code (EDC) detector 162. As the SNR degrades, the channel monitor 152 receives the error statistics from LDPC decoded pages at 168 and parity verification past the detector 162 at 170. Once the parity is verified, channel conditions such as error statistics can be obtained and analyzed to determine whether to trigger the choice of a different code rate in code selection module 158. At that point, new incoming user data may be coded using the newly selected code rate (158) at the encoder module 154 and decoded accordingly at the decoder module 156. For example, a read of a page from block A may indicate that errors are increasing, and thus future pages to be encoded for writing to block A may require a new code rate. In one embodiment, the channel monitor may track/monitor error statistics by pages/blocks, and adjust the code selection for the individual pages/blocks.

In one embodiment, the code selection module 158 includes a registry to indicate the format of the data over the encoded blocks. The channel monitor 152 may also generate soft information that is used for decoding.

Finally, in one embodiment, the controller 130 may include an outer RAID module 160 such as one based on a Reed-Solomon-based RAID protection scheme. The RAID module 160 may provide additional protection by using additional parity data to protect across RAID stripes of multiple pages.

Adaptive Data Coding

Figure 2:
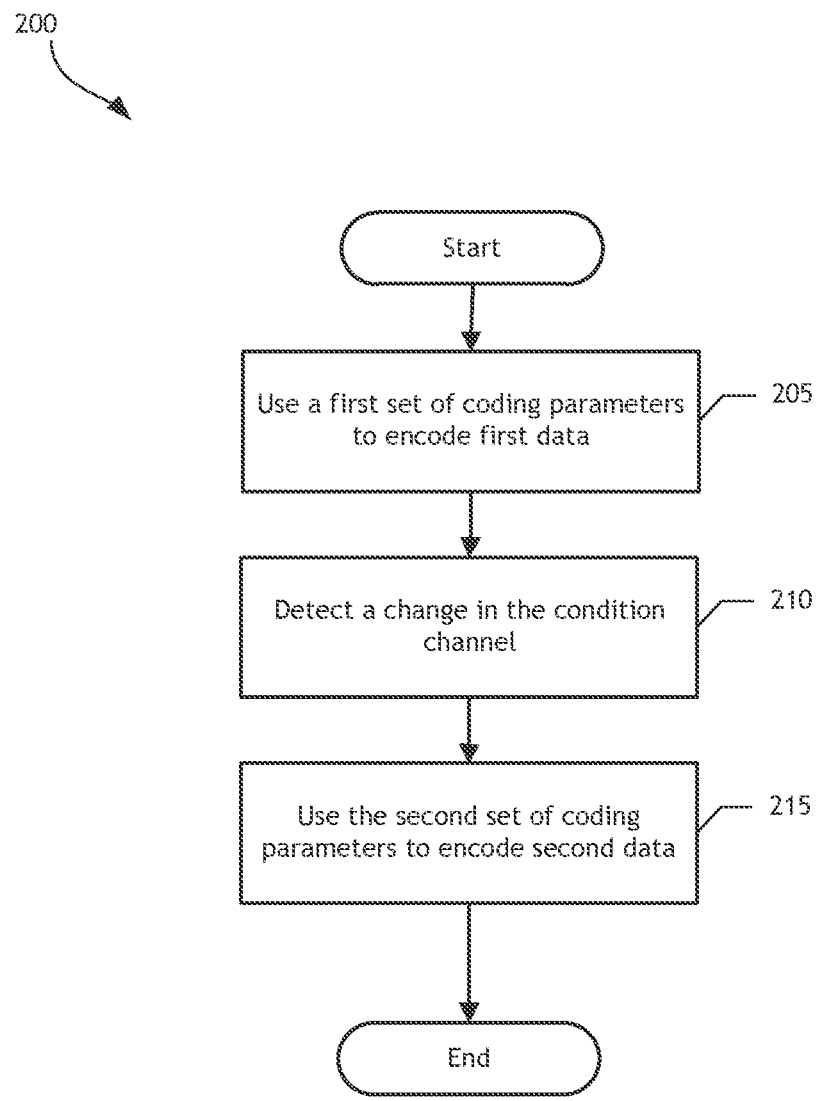
FIG. 2 is a flow diagram illustrating a process of determining coding parameters for coding data according to one embodiment of the invention.

FIG. 2 is a flow diagram illustrating a process 200 of determining coding parameters for coding data according to one embodiment of the invention. The process 200 can be executed by the controller 130. Advantageously, the process 200 can enable the controller 130 to adjust the coding parameters based on monitored conditions of the channel such as channel error statistics and channel reliability.

At block 205, the process 200 uses a first set of coding parameters to encode first data. For example, at the beginning of life of the data storage device, a smaller amount of parity data (i.e., a code rate) may be used. Then at block 210, the process 200 monitors the channel, and detects changes such as changes in error statistics and channel reliability. Error statistics can include raw bit error rates, 0→1 and/or 1→0 bit flip rates, number of iterations used by the LDPC decoder to converge. In addition, other metrics such as program/erase (PE) cycle count may also be used as a factor to determine channel reliability. In some embodiments using MLC cells, the read back comprises comparing the voltage of the cell to a plurality of voltage thresholds. In such an embodiment, the bit errors occurring at each nominal or page-specific voltage threshold may also be included in the error statistics. The error statistics may be in absolute terms, percentage terms, and/or mean/average terms. For example, the error statistics may include a bit error rate encountered during read of a single memory page or an average bit error rate encountered during read operations of a group of memory pages.

Accordingly, at block 215, the process 200 uses a second set of coding parameters to encode second data. For example, the second set of coding parameters may lead to a lower code rate, which offers better protection against errors. Alternatively, the second set of coding parameters may lead to a higher code rate, which provides a higher storage efficiency. As will be further described in FIG. 3B, in one embodiment the first and second sets of LDPC coding parameters are drawn from a pre-defined collection of sets of coding parameters having the same or similar code word lengths, with each set of coding parameters using a different code rate.

To further illustrate the example process in FIG. 2, consider a case where the first and second data may be written to a common block A. In one embodiment, the error statistics may be gathered from operations that read pages from that block. However, the error statistics need not be from the same block. They could come from one or more read operations on a block that is different from the block in which the first and second data are stored (block A). In one embodiment, a reference block may be used and error statistics may be gathered by reading one or more pages from the reference block. Also, error statistics may be gathered from reading any data pages with valid ECC (i.e., pages can be successfully decoded).

The process 200 allows the data storage device to account for the typical degradation pattern exhibited in a non-volatile memory array channel. Such channel typically exhibits a tri-modal regime in its error behavior. Thus, codes must be designed according to the channel behavior rather than keep them static. The tri-model regime follows this pattern.

First, in the early life, the error rate is usually very good, but some blocks could be defective leading to catastrophic failures. Nominal errors from the flash system due to occasional bit flips can be handled by the LDPC system. In one embodiment, the data storage system includes an additional data protection in form of a RAID array configuration, and catastrophic failures due to such defects encountered in the early life are handled by the error correcting code of the RAID array (e.g., handled by RS RAID 160 in FIG. 1).

Second, in the mid-life phase of the data storage device, the device is expected to work under nominal conditions subject to wear leveling and P/E cycles.

Third, in the end-of-life or near end-of-life phase, the device SNR is degraded. High rate codes will not provide the necessary performance as the channel capacity is already degraded with a lower SNR due to wear leveling. Thus, at this stage, in one embodiment, low code rates are used to alleviate the decreased SNR. In one embodiment the controller is able to switch to such code rates based on the monitored channel condition.

Effect of Coding Parameters

There are several parameters that govern LDPC performance: (1) column weight, (2) parallelism, and (3) code length. The first parameter is column weight, which is a key parameter that governs the performance in error floor and waterfall region. In addition, mis-correction probabilities for LDPC are linked to the choice of column weight.

The second parameter is the choice of parallelism. The larger the parallelism, the better the ability of the code for correcting burst errors. However, too much parallelism may not be practical for realizing hardware solutions with the current VLSI technology.

The third parameter is code length. Larger code lengths are known to improve performance, but may not be practical for realizing hardware solutions with current VLSI technology. In addition, larger code lengths may increase the latency of the storage system. Additional example parameters are shown in FIG. 3B, which will be discussed later in the disclosure.

Adaptive Data Coding with Various Vendor Sizes

In one embodiment, beyond the ability to dynamically adjust the code rate used in response to the changing condition detected at the channel, the controller of the data storage device can also accommodate various types of non-volatile memory arrays from different vendors that may have different internal page sizes. In the various embodiments described below, a nominal base code that works for most vendor memory is used as a starting point. If a certain memory type has shorter E-page size, the code in one embodiment is shortened by puncturing and then doing an erasure decoding over the received coded block. It is noted that the performance however will slightly deteriorate but the native solution can be retained without changing the architecture drastically to accommodate different memory formats.

Figure 3A:
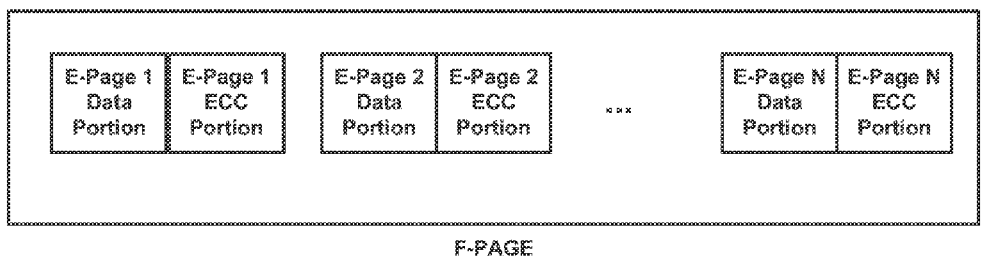
FIG. 3A shows an example F-page format according to one embodiment of the invention.

As shown in FIG. 3A, an F-page may include several E-pages, shown as E-page data portion and their ECC parity (e.g., LDPC parity) data. For example, a memory page size can correspond to an E-page size of the non-volatile memory array, and the process 200 can calculate the E-page size by looking-up a vendor provided F-page size of the memory array and dividing the F-page size by an appropriate constant for the non-volatile memory array, such as 4 or 8. In other embodiments, the memory page size can correspond to an F-page size.

Each vendor may have a different F-page size, and hence the E-page size may be different as well. In addition, while an F-page size is fixed (as it corresponds to a physical entity), an E-page size may be adjusted. For example, the portion of an F-page allocated to store ECC can increase as the data storage system ages, and correspondingly each E-page will be smaller (store less user data) and its counterpart ECC portion will be bigger. Note that FIG. 3A is showing one example data layout configuration. For example, in another embodiment, the ECC portion of an E-page may be stored immediately adjacent to the user data portion. Also, some vendors pre-allocate for each F-page a reserved area for ECC parity data storage.

In one embodiment, the controller 130 is configured to support multiple non-volatile memory page formats (e.g. different F-page sizes and/or different ECC reserved area sizes), with each format assigned a pre-defined collection of sets of coding parameters. Each such collection may be associated with a pre-defined LDPC code word length to enable the support of multiple non-volatile memory page formats. In one embodiment, the controller 130 is configured to support different memory page formats, and at least one of the supported memory page formats does not have a page length that is equal to any of the plurality of pre-defined LDPC code word lengths associated with the collections.

Thus, in one embodiment, several collections of sets of parameters (each collection being associated with a different code word length) are used to accommodate memory from different vendors. Within each collection are sets of coding parameters that can be dynamically selected in response to changing conditions in the channel.

FIG. 3B is a table 300 illustrating relationships between LDPC coding parameters and LDPC code word lengths according to one embodiment of the invention. The table 300 can designate the LDPC code word lengths and LDPC coding parameters supported by a controller, such as the controller 130, the encoder 154, and/or the decoder 156. The table 300 can be stored in the non-volatile memory array 140, one or more other storage media of the data storage system 120, and/or in the internal memory of the controller 130, the encoder 154, and/or the decoder 156. The table 300 includes two example code length columns indicating two supported LDPC code word lengths. One LDPC code word length equals 576 bytes (512+64·1 bytes), and the other LDPC code word length equals 640 bytes (512+64·2 bytes). In practice, there may be many more code lengths that are used in such a table. The same principles disclosed here can apply to pages of other sizes.

For each code length collection, the LDPC coding parameters of column weight, P matrix size, and row weight can be varied to enable coding of data using different designed code rates (e.g., different amounts of user data per total data of a data unit, where total data includes user data and parity data) as listed in table 300. For example, if the LDPC code word length equals 576 bytes, the applied LDPC coding parameters can be one of the LDPC coding parameter sets at circles C1, C2, C3, or C4.

In one instance, the LDPC coding parameters can be chosen at circle C3, which correspond to a column weight of 7, P matrix size of 128, and row weight of 36 and further to a code rate of 0.806 (464 bytes of user data for 576 bytes of total code length). Further, in one embodiment, the code length, which may be defined as $512+64 \times \Delta$, can be adjusted based on selecting $\Delta$ as 1, 2, etc.

As will be further explained, the various pre-defined code lengths can be used to accommodate memory arrays of different page sizes that may be made by different vendors. For example, as shown, the two code lengths of 576 and 640 bytes can accommodate page sizes of 576 and 640 bytes. In addition, other similar sizes may also be supported by using code shortening, which will be described in conjunction with FIGS. 4A-4C.

A controller supporting the LDPC coding parameters of table 300 can advantageously select one code length for a non-volatile memory array and adjust the LDPC coding parameters to code data at different code rates. For instance, when a memory array with a page size of 576 bytes is relatively new (e.g., lightly used) and/or experiences or exhibits few readback errors, the LDPC coding parameters at circle C1 can be selected for coding data. The LDPC coding parameters at circle C1 correspond to a column weight of 7, P matrix size of 64, and row weight of 72 and further to a code rate of 0.903. A total of 56 bytes of parity can be used for coding 520 bytes of data at circle C1. As memory pages, blocks, or dies of the memory array age and/or wear out (as indicated, for example, by the observed condition(s) in the channel by the channel monitor 152), the LDPC coding parameters at circles C2, C3, and C4 can instead be selected for coding data. The controller can, accordingly, gradually increase the amount of parity per unit data from a code rate of 0.903 to codes rates of 0.889, 0.806, and 0.778 at circles C2, C3, and C4, respectively, in response to changes in the quality (e.g., loss of quality) of the non-volatile memory array.

In one embodiment, the code rate information is saved on a per block basis. That is, pages in a memory block are encoded at the same code rate, and information is saved in one embodiment in a non-volatile memory. As such, pages in blocks that are programmed at different times may be encoded with different code lengths, and the saved information is used to properly decode pages from the various blocks. In other embodiments, such information is tracked at the page level, or at other granularity that is greater than a block (e.g., a superblock which is a collection of memory blocks).

Adaptive Code Shortening

Through adaptive code shortening, some embodiments of the invention can accommodate memory arrays with page sizes that do not match up exactly with the pre-defined code lengths. In this manner, the controller can be coupled with any new non-volatile memory arrays with different sizes with little loss in performance.

Figure 4A:
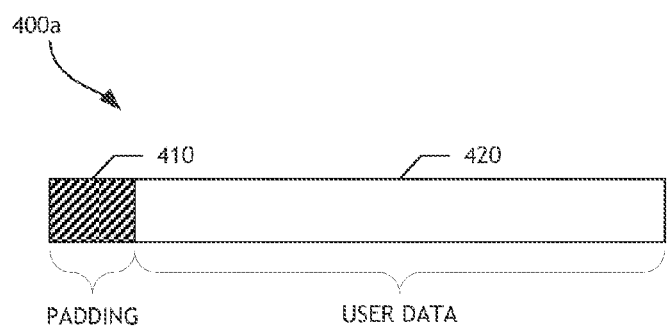
FIGS. 4A-4C are diagrams illustrating padded user data and parity data according to one embodiment of the invention.
Figure 4B:
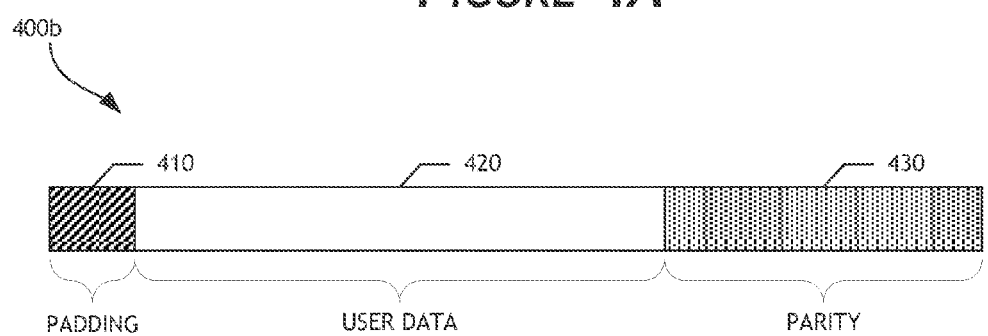
Figure 4C:
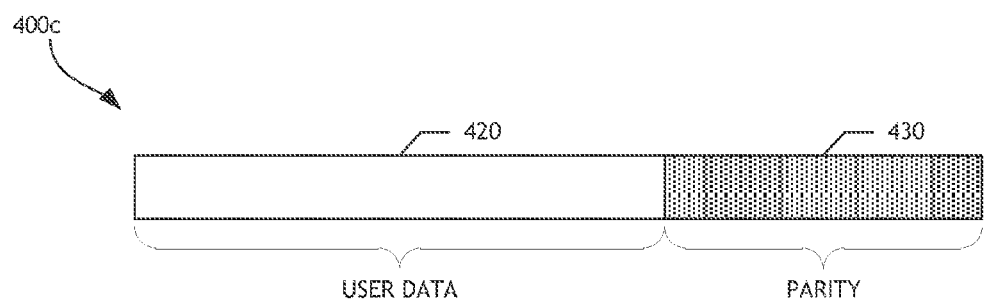

FIGS. 4A-4C are diagrams illustrating padded user data and parity data used in adaptive code shortening according to one embodiment of the invention. In particular, FIGS. 4A-4C illustrate how shortening may be used to adapt code word lengths to match the memory page size for a non-volatile memory array. Advantageously, shortening enables the controller 130 to support a memory page format in which the memory page size does not equal any code word length of a plurality of pre-defined code word lengths. For instance, if the controller 130 supports pre-defined LDPC code word lengths equal to 576 and 640 bytes, shortening can be used so that the controller 130 further supports a memory page size of 564 bytes, for example, by shortening the code word length of 576 bytes. Moreover, shortening can permit the controller 130 to adaptively code data to match the non-volatile memory array format without sacrificing a large bit error rate performance.

In one embodiment, shortening comprises three operations. First, padding data is added to the user data to be encoded. The padding data in one embodiment is sized to be the difference between the pre-defined code length and memory page size. Second, parity data is generated based on the padding and user data. Third, the user data and parity data, which add up to the memory page size, are stored in the memory page. The padding data is not stored, but will be appended to the user data upon decoding (e.g., when the user data and parity data is read out from the memory page at a later time).

FIG. 4A illustrates padding 410 and user data 420 of a data unit 400a. The user data 420 corresponds to an amount of user data for data unit 400a, and the padding 410 corresponds to a padding that facilitates code shortening. The padding 410 can include a data set of entirely zeros, entirely ones, etc., or any known or pre-defined data pattern. Continuing the example of the previous paragraph, if the memory page size is 564 bytes for the non-volatile memory array, the controller 130 can select, from various pre-defined code lengths such as those shown in table 300, the shortest LDPC code word length having a size equal to or greater than 564 bytes. In this case, the code length of 576 bytes is selected. The controller 130 can determine that the padding 410 should include a data set having length that is equal to the difference between the code word length (576) and the memory page size (564) of the non-volatile memory array, or 576−564=12 bytes of padding data. Depending on the LDPC coding parameters for the data unit 400a, the controller 130 can further determine an amount of bytes reserved for user data 420 and an appropriate G coding matrix for determining and/or generating parity data.

FIG. 4B illustrates an example encoding process according to one embodiment. In effect, the user data 420 is "padded" so that the combined user data and padding meet the amount of bytes reserved for user data in the chosen pre-defined code length. The parity 430 is then generated for the combined padding 410 and user data 420 of a data unit 400b. Continuing the example of the previous paragraph, the appropriate G coding matrix can be used to determine LDPC parity data for parity 430. Note that as described above, the actual distribution of the 576 bytes between padding 410, user data 420, and parity data 430 may vary. The following table illustrates some of the possible configurations (all sizes in bytes):

| Memory Page Size 564 bytes | | | |
| --- | --- | --- | --- |
| | Code Length - 576 | | |
| Configuration C1 (FIG. 3B) | Reserved for User Data 520 | | Reserved for Parity 56 |
| With Shortening Scheme | Padding (FIG. 4 - 410) 12 | Actual User Data (FIG. 4 - 420) 508 | Parity (FIG. 4 - 430) 56 |
| Memory Page Size | Not written to memory | 564 (508 + 56) | |

| Memory Page Size 564 bytes | | | |
| --- | --- | --- | --- |
| | Code Length - 576 | | |
| Configuration C3 (FIG. 3B) | Reserved for User Data 464 | | Reserved for Parity 112 |
| With Shortening Scheme | Padding (FIG. 4 - 410) 12 | Actual User Data (FIG. 4 - 420) 452 | Parity (FIG. 4 - 430) 112 |
| Memory Page Size | Not written to memory | 564 (452 + 112) | |

FIG. 4C illustrates a data unit 400c, having user data 420 and parity 430 of the data unit 400b with padding 410 removed. The user data 420 and the parity 430 can be written to and subsequently read from a memory page of the non-volatile memory array 140. As shown in the tables above, the amount of user data 420 and parity data 430 can equal the memory page size of the non-volatile memory array, and the padding data is not written to the page. When the page is read out later, as part of the decoding, the padding is appended back to the user data read from the page. In this manner, coding for arbitrary page sizes can be performed using one of the plurality of pre-defined code word lengths at the cost of a small loss in coding efficiency.

Figure 5:
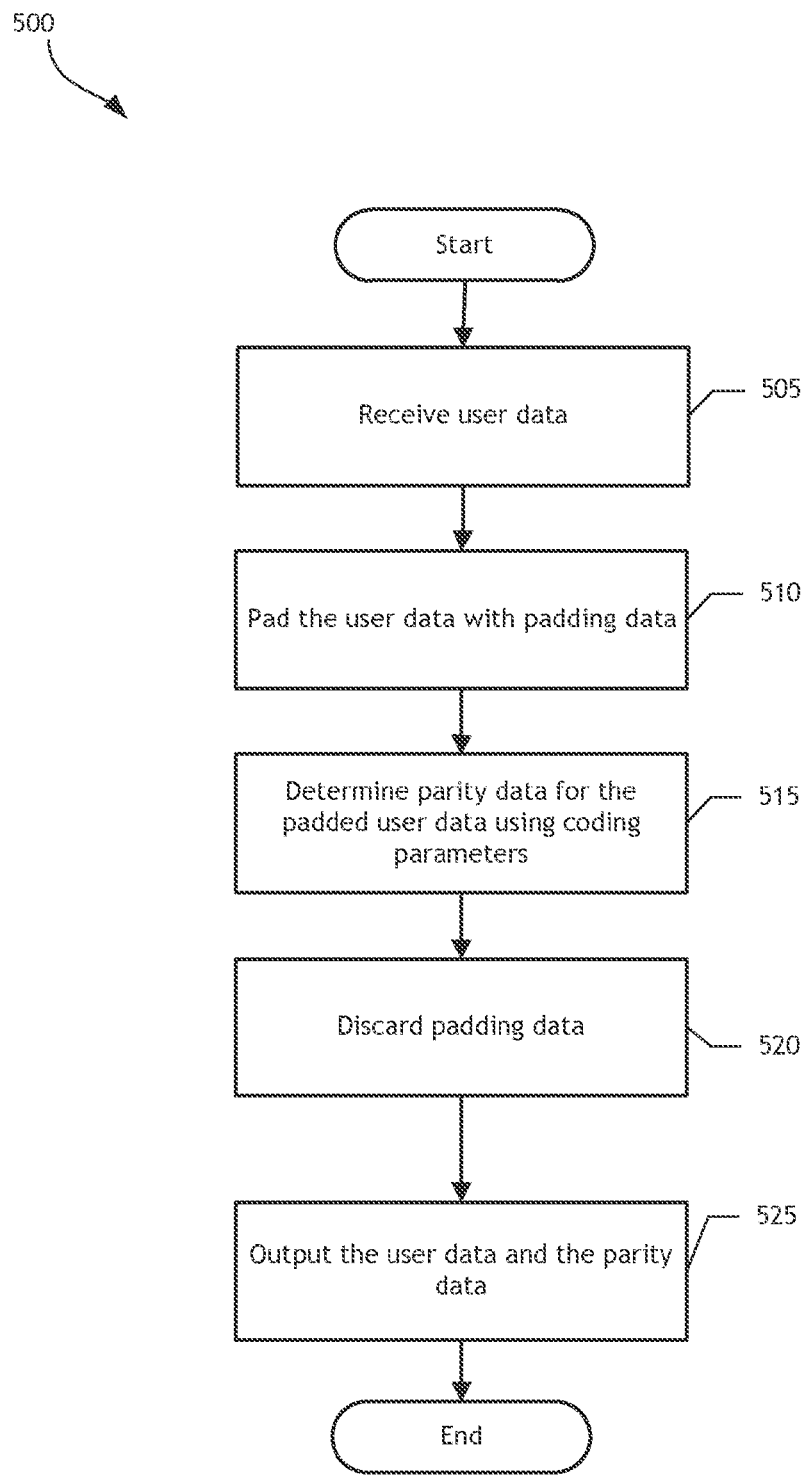
FIG. 5 is a flow diagram illustrating a process of adaptive code shortening according to one embodiment of the invention.

FIG. 5 is a flow diagram illustrating a process 500 of adaptive code shortening according to one embodiment of the invention. The process 500 can be executed by the controller 130. Advantageously, the process 500 can enable the controller 130 to support memory page sizes that do not equal any code word length of a plurality of pre-defined code word lengths supported by the controller 130. The process 500 can be used to construct and manage data units 400*a*, 400*b*, and 400*c* described in FIGS. 4A-4C.

At block 505, the process 500 receives user data. The user data can be received from the storage interface module 112 along with a write command to write the user data to a non-volatile memory array, such as the non-volatile memory array 140.

At block 510, the process 500 pads the user data with padding data. The padding data can include a data set of entirely zeros, entirely ones, or a known or pre-defined data pattern. In addition, at block 510, the process 500 can further divide the user data into units having a size equal to an amount of user per data unit, which depends on corresponding coding parameters. For example, if the non-volatile memory array has a memory page size equal to 564 bytes and the LDPC coding parameters correspond to the parameters at circle C3 of FIG. 3B, the user data can be divided into units having a size equal to 452 bytes.

At block 515, the process 500 determines parity data for the padded user data using coding parameters. Continuing the example of the previous paragraph, if the LDPC coding parameters correspond to the parameters at circle C3, an appropriate G coding matrix can be selected and used to determine LDPC parity data for the padded user data.

At block 520, the process 500 outputs the user data and parity data. For example, the process 500 can output the user data and parity data for storage to E-page 144 of F-page 143 of the non-volatile memory array 140. It can be noted that the padding described with to respect to blocks 510 and 515 can be characterized as "virtual padding" since the padding itself may not be written to the memory page.

Code Rate Adjusting—Additional Details

Figure 6:
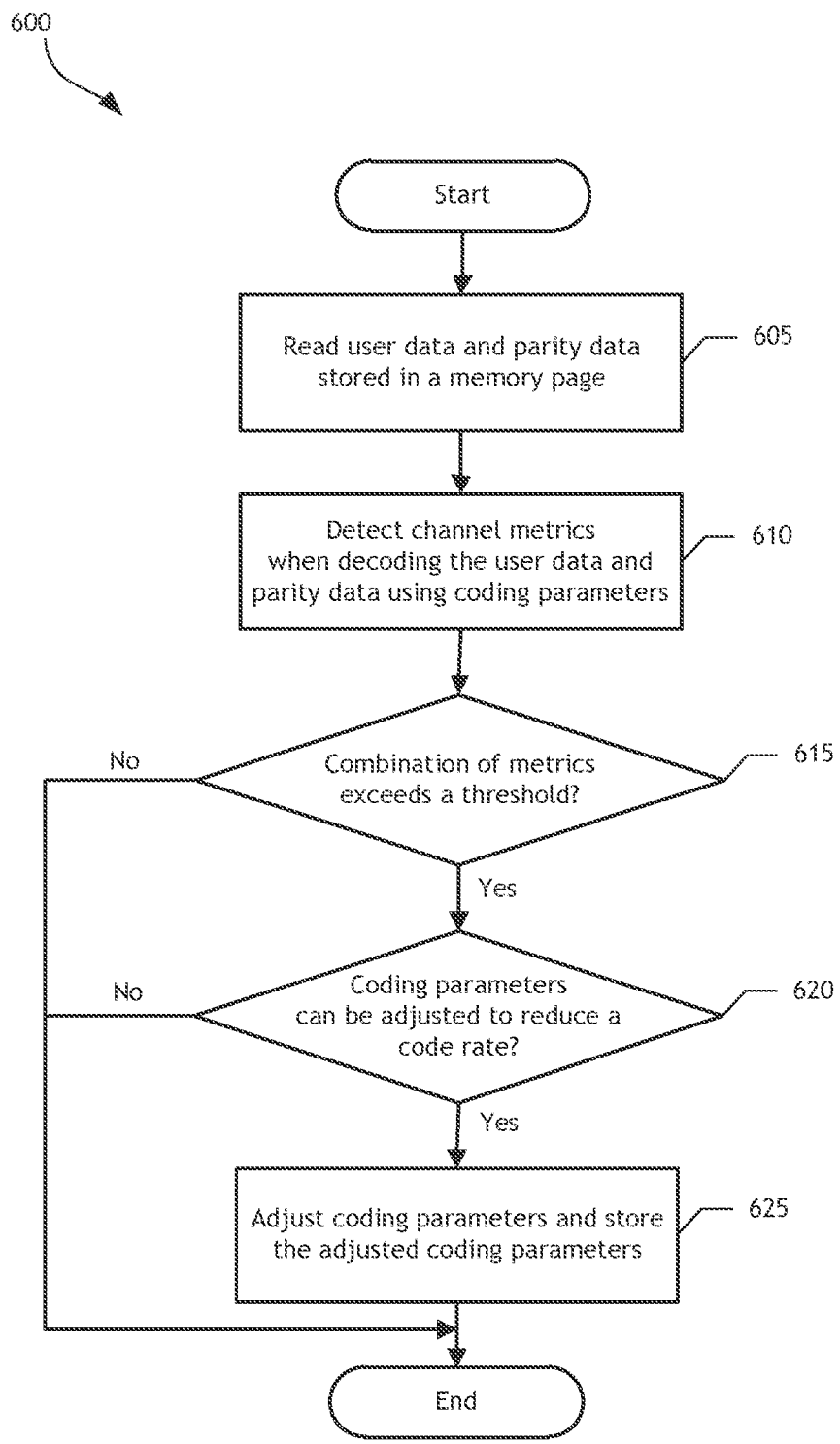
FIG. 6 is a flow diagram illustrating a process of adjusting a code rate according to one embodiment of the invention.

FIG. 6 is a flow diagram illustrating a process 600 of adjusting a code rate according to one embodiment of the invention. The process 600 can be executed by the controller 130. Advantageously, the process 600 can enable the controller 130 to adjust the code rate (e.g., an amount of parity per unit data) of memory pages, blocks, or other divisions of a non-volatile memory array as the memory pages, blocks, or other divisions wear out and/or experience decreased quality.

At block 605, the process 600 reads user data and parity data stored in a memory page. For example, the process 600 can perform a read of F-page 143 in response to a read command from the host system 110.

At block 610, the process 600 detects channel metrics (e.g., number of bit errors) when decoding the user data using parity data and coding parameters. For instance, the process 600 can determine a number of detected bit errors when decoding the user data using stored parity data and LDPC coding parameters corresponding to the memory page. The channel metrics can include various measures such as raw bit error rates, 0→1 and/or 1→0 bit flip rates, number of iterations used by the LDPC decoder to converge, a program/erase (PE) cycle count, etc. In some embodiments using MLC cells, the bit errors occurring at each nominal or page-specific voltage threshold may be a channel metric. The metrics may be in absolute terms, percentage terms, and/or mean/average terms. For example, the metrics may include a bit error rate encountered during read of a single memory page or an average bit error rate encountered during read operations of a group of memory pages. Indeed, any metric that distinguishes stronger from weaker pages may be used as part of the determination.

At block 615, the process 600 determines whether a combination of metrics exceeds a threshold. The threshold can depend or vary based on the coding parameters for coding data to the memory page. For example, the threshold for the LDPC coding parameters at circle C1 of FIG. 3B may be lower than the threshold for the LDPC coding parameters at circle C2. If the process 600 determines that the threshold has not been exceeded, the process 600 terminates. On the other hand, if the process 600 determines that the threshold has been exceeded, the process 600 moves to block 620.

At block 620, the process 600 checks whether the coding parameters can be adjusted to reduce a code rate. In other words, the process 600 can determine whether more parity data can be used for coding. In one embodiment, the process 600 can determine whether the LDPC coding parameters may be adjusted while keeping a LDPC code word length unchanged. For instance, if E-page 144 is currently coded using the LDPC coding parameters at circle C3 of FIG. 3B, the LDPC coding parameters can be adjusted to the parameters at circle C4. Alternatively, if E-page 144 currently is coded using LDPC coding parameters at circle C4 and the table 300 contains the only available LDPC coding parameters, the parameters may not be further adjusted to a lower code rate. If the process 600 determines that the coding parameters may not be adjusted to reduce the code rate, the process 600 terminates. On the other hand, if the process 600 determines that the coding parameters can be adjusted to reduce a code rate, the process 600 moves to block 625. In one embodiment, the change of code rate may be managed at a block level where the pages in the block are switched to a new code rate at the same time. In one embodiment, where MLC memory is used, upon a determination that a further reduced code rate cannot be used, rather than terminating the process 600, the page (or block of pages) may be configured to operate in SLC (single-level coding) mode or an MLC mode that may store a fewer number of charge levels in a cell.

At block 625, the process 600 adjusts the coding parameters and stores the adjusted coding parameters to reduce a code rate for a next write operation. The process 600 can store the adjusted coding parameters in the non-volatile memory array 140, other memory module of the data storage system 120, and/or internal memory of the controller 130. The process 600 can store an indication of the code rate or LDPC coding parameters for coding data to facilitate management of LDPC coding parameters on a memory page, block, or other level division of a non-volatile memory array. Further, the adjusted coding parameters can be used for coding user data associated with a subsequent write command received from the host system 110. In some embodiments, data stored in the affected memory page, block, or other level division of a non-volatile memory may be read and re-written using the adjusted coding parameters. In other embodiments, data stored in the affected memory page, block, or other level division of a non-volatile memory may be read and re-written in a second division of the non-volatile memory using the LDPC coding parameters associated with the second division of the non-volatile memory.

Other Variations

Those skilled in the art will appreciate that in some embodiments, other approaches and methods can be used. For example, the coding techniques disclosed herein can apply to codes besides LDPC codes, such as other iterative codes like turbo codes. In addition, although the coding parameters and other values disclosed in the table 300 of FIG. 3B illustrate an example set of relationships between coding parameters and code word lengths, other or additional coding relationships can be used. The table 300 can include different values than as shown. Further, an amount of parity data in each data unit can be set to different values or varied depending on a quality of a storage medium. Additionally, quality metrics other than or in addition to bit errors can be used to determine whether to adjust coding parameters for coding data. Moreover, depending on the embodiment, certain of the steps described above may be removed, and others may be added.

The non-volatile memory array 140 can be implemented using NAND flash memory devices. Other types of solid-state memory devices can alternatively be used, such as array of flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistance RAM (RRAM), NOR memory, EEPROM, Ferroelectric Memory (FeRAM), Magnetoresistive RAM (MRAM), other discrete NVM (non-volatile memory) chips, or any combination thereof. In one embodiment, the non-volatile memory array 140 preferably includes multi-level cell (MLC) devices having multi-level cells capable of storing more than a single bit of information, although single-level cell (SLC) memory devices or a combination of SLC and MLC devices may be used. In one embodiment, the data storage system 120 can include other memory modules, such as one or more magnetic memory modules. The data storage system 120 can further include other types of storage media, such as magnetic storage. Accordingly, the scope of the present disclosure is intended to be defined only by reference to the appended claims.

While certain embodiments have been described, these embodiments have been presented by way of example only, and are not intended to limit the scope of the protection. Indeed, the novel methods and systems described herein may be embodied in a variety of other forms. Furthermore, various omissions, substitutions and changes in the form of the methods and systems described herein may be made without departing from the spirit of the protection. The accompanying claims and their equivalents are intended to cover such forms or modifications as would fall within the scope and spirit of the protection. For example, the systems and methods disclosed herein can be applied to hard disk drives, hybrid hard drives, and the like. In addition, other forms of storage (e.g., DRAM or SRAM, battery backed-up volatile DRAM or SRAM devices, EPROM, EEPROM memory, etc.) may additionally or alternatively be used. As another example, the various components illustrated in the figures may be implemented as software and/or firmware on a processor, ASIC/FPGA, or dedicated hardware. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A data storage system, comprising:
a non-volatile memory array comprising a plurality of memory pages; and
a controller coupled to the non-volatile memory array through a data channel, the controller being configured to:
use a first set of low-density parity-check (LDPC) coding parameters to encode at a first code rate first data to be stored into the non-volatile memory array through the data channel, wherein the first set of LDPC coding parameters define a characteristic of a first matrix used to encode the first data;
detect a change in a condition of the data channel; and
in response to said detecting, use a second set of LDPC coding parameters to encode at a second code rate different from the first code rate second data to be stored into the non-volatile memory array through the data channel,
wherein the second set of LDPC coding parameters define a characteristic of a second matrix used to encode the second data and are different from the first set of LDPC coding parameters.

2. The data storage system of claim 1, wherein the controller is further configured to select the first or second set of LDPC coding parameters from a pre-defined collection of sets of coding parameters having the same LDPC code word length.

3. The data storage system of claim 2, wherein each set of coding parameters of the pre-defined collection enables coding by the controller at a different code rate.

4. The data storage system of claim 2, wherein the controller is further configured to select the pre-defined collection of sets of coding parameters from a plurality of pre-defined collections of sets, and at least some of the plurality of pre-defined collections of sets have different pre-defined LDPC code word lengths, the controller being further configured to support coding for multiple non-volatile memory page formats using the plurality of pre-defined collections of sets.

5. The data storage system of claim 4, wherein at least one of the multiple non-volatile memory page formats does not have a page length that is equal to any of the pre-defined LDPC code word lengths associated with the plurality of pre-defined collections of sets.

6. The data storage system of claim 5, wherein the controller is further configured to use the first set of LDPC coding parameters to encode the first data by at least:
adding an amount of padding data to the first data;
determining parity data for the first data and the padding data using the first set of LDPC coding parameters; and
storing the first data and the parity data into the non-volatile memory array.

7. The data storage system of claim 6, wherein the amount of the padding data depends at least in part on a difference between the pre-defined LDPC code word length of the first set of LDPC coding parameters and a common memory page size for the non-volatile memory array.

8. The data storage system of claim 1, wherein the change in the condition of the data channel is detected through using at least a signal to noise (SNR) ratio.

9. The data storage system of claim 1, wherein the change in the condition of the data channel is detected through using one or more error statistics including: a bit error rate encountered during a read operation of a memory page in the non-volatile memory array, an average bit error rate encountered during read operations of a group of memory pages, a program/erase (PE) cycle count, and a number of LPDC iterations used to converge.

10. The data storage system of claim 9, wherein the first and second data are stored in the same block of the non-volatile memory array, and the one or more error statistics is from at least one memory page from the same block.

11. The data storage system of claim 9, wherein the first and second data are stored in the same block of the non-volatile memory array, and the one or more error statistics is from one or more read operations on a block that is different from the block in which the first and second data are stored.

12. The data storage system of claim 11, wherein the one or more error statistics is from one or more memory pages of a reference block.

13. The data storage system of claim 11, wherein the one or more error statistics is from one or more memory pages that have been successfully decoded.

14. The data storage system of claim 1, wherein the first or second set of LDPC coding parameters comprises a P matrix size, a column weight, and a row weight, and further comprises at least one of a code rate, an amount of user data, and an amount of parity data.

15. The data storage system of claim 1, wherein the plurality of memory pages comprises error-correcting code pages (E-pages).

16. The data storage system of claim 1, wherein the controller is further configured to store an indication of a code rate for data written to one or more blocks of memory of the non-volatile memory array.

17. A method for operating a data storage system comprising a non-volatile memory array comprising a plurality of memory pages, the non-volatile memory array accessible through a data channel, the method comprising:
   using a first set of low-density parity-check (LDPC) coding parameters to encode at a first code rate first data to be stored into the non-volatile memory array through the data channel, wherein the first set of LDPC coding parameters define a characteristic of a first matrix used to encode the first data;
   detecting a change in a condition of the data channel; and
   in response to said detecting, using a second set of LDPC coding parameters to encode at a second code rate different from the first code rate second data to be stored into the non-volatile memory array through the data channel,
   wherein the second set of LDPC coding parameters define a characteristic of a second matrix used to encode the second data and are different from the first set of LDPC coding parameters.

18. The method of claim 17, further comprising selecting the first or second set of LDPC coding parameters from a pre-defined collection of sets of coding parameters having the same LDPC code word length.

19. The method of claim 18, wherein each set of coding parameters of the pre-defined collection enables coding at a different code rate.

20. The method of claim 18, further comprising selecting the pre-defined collection of sets of coding parameters from a plurality of pre-defined collections of sets, and at least some of the plurality of pre-defined collections of sets have different pre-defined LDPC code word lengths to enable supporting of coding for multiple non-volatile memory page formats.

21. The method of claim 20, wherein at least one of the multiple non-volatile memory page formats does not have a page length that is equal to any of the pre-defined LDPC code word lengths associated with the plurality of pre-defined collections of sets.

22. The method of claim 21, wherein said using the first set of LDPC coding parameters to encode the first data further comprises:
   adding an amount of padding data to the first data;
   determining parity data for the first data and the padding data using the first set of LDPC coding parameters;
   storing the first data and the parity data into the non-volatile memory array through the data channel.

23. The method of claim 22, wherein the amount of the padding data depends at least in part on a difference between the pre-defined LDPC code word length of the first set of LDPC coding parameters and a common memory page size for the non-volatile memory array.

24. The method of claim 17, wherein the change in the condition of the data channel is detected through using at least a signal to noise (SNR) ratio.

25. The method of claim 17, wherein the change in the condition of the data channel is detected through using one or more error statistics including: a bit error rate encountered during a read operation of a memory page in the non-volatile memory array, an average bit error rate encountered during read operations of a group of memory pages, a program/erase (PE) cycle count, and a number of LPDC iterations used to converge.

26. The method of claim 25, wherein the first and second data are stored in the same block of the non-volatile memory array, and the one or more error statistics is from at least one memory page from the same block.

27. The method of claim 25, wherein the first and second data are stored in the same block of the non-volatile memory array, and the one or more error statistics is from one or more read operations on a block that is different from the block in which the first and second data are stored.

28. The method of claim 27, wherein the one or more error statistics is from one or more memory pages of a reference block.

29. The method of claim 27, wherein the one or more error statistics is from one or more memory pages that have been successfully decoded.

30. The method of claim 17, wherein the first or second set of LDPC coding parameters comprises a P matrix size, a column weight, and a row weight, and further comprises at least one of a code rate, an amount of user data, and an amount of parity data.

31. The method of claim 17, wherein the plurality of memory pages comprises error-correcting code pages (E-pages).

32. The method of claim 17, further comprising storing an indication of a code rate for data written to one or more blocks of memory of the non-volatile memory array.

33. The data storage system of claim 4, wherein the controller is further configured to support coding for a first memory page format of the multiple non-volatile memory page formats using the pre-defined collection of sets of coding parameters, and the controller is further configured to support coding for a second memory page format of the multiple non-volatile memory page formats using another pre-defined collection of sets of coding parameters of the plurality of pre-defined collections of sets, the first memory page format being different from the second memory page format and the pre-defined collection of sets of coding parameters having a different pre-defined LDPC code word length from the another pre-defined collection of sets of coding parameters.

\* \* \* \* \*